United States Patent [19]

Glogolja

[11] 4,149,124
[45] Apr. 10, 1979

[54] THERMAL PROTECTION OF AMPLIFIERS

[75] Inventor: Miroslav Glogolja, Somerville, N.J.

[73] Assignee: RCA Corporation, New York, N.Y.

[21] Appl. No.: 856,211

[22] Filed: Dec. 1, 1977

Related U.S. Application Data

[63] Continuation-in-part of Ser. No. 638,845, Dec. 8, 1975, abandoned.

[30] Foreign Application Priority Data

May 2, 1975 [GB] United Kingdom ............... 18592/75

[51] Int. Cl.$^2$ ............................................. H03F 21/00
[52] U.S. Cl. .................................. 330/298; 330/143; 330/207 P; 361/105
[58] Field of Search ...................... 330/143, 207P, 289, 330/298; 361/54, 103, 105, 106

[56] References Cited

U.S. PATENT DOCUMENTS

| | | | |
|---|---|---|---|
| 2,331,530 | 10/1943 | Zinn | 330/143 X |
| 2,866,017 | 12/1958 | Jones, Jr. | 330/289 X |
| 3,480,835 | 11/1969 | Richman | 330/143 X |
| 3,541,457 | 11/1970 | Leighty et al. | 330/207 P X |
| 3,588,729 | 6/1971 | Satterfield | 330/207 P |

Primary Examiner—Lawrence J. Dahl
Attorney, Agent, or Firm—Christoffersen H.; A. L. Limberg; J. M. O'Meara

[57] ABSTRACT

A method and circuit for protecting the output stage of an amplifier from thermal overload. A normally-open, temperature sensitive switch is thermally coupled to the transistors in the output stage and electrically connected across a portion of the feedback resistance element of the amplifier, in one circuit embodiment. Whenever the temperature of the transistors reaches a predetermined threshold level, the switch closes and acts as a low resistance path across that portion of the feedback resistance element, thereby reducing the gain of the amplifier to a safe level which is zero in the preferred embodiment. Thereafter, when the temperature decreases below the predetermined threshold level, the switch automatically opens to restore normal operation of the amplifier.

7 Claims, 2 Drawing Figures

THERMAL PROTECTION OF AMPLIFIERS

This is a continuation-in-part application based on copending U.S. Patent Application Ser. No. 638,845 filed Dec. 8, 1975, now abandoned.

The present invention relates generally to amplifiers, and more specifically to a thermal protection circuit for transistorized amplifiers.

The transistors of the output stage of an amplifier, such as an audio amplifier, for example, must be protected against periods of thermal overload, which may cause damage to or failure of the output transistors. One common way such thermal protection is obtained is to place the contacts of a normally closed temperature sensitive switch (TSS), which is thermally coupled to the output stage, in series with the primary of a power transformer of the amplifier. When the temperature of the output stage reaches a predetermined level, the TSS contacts open, disconnecting the power from the amplifier. When the output transistors cool to a safe operating temperature, the TSS automatically closes and normal operation of the amplifier is restored. One problem with this method of protection is that it is limited to low and medium power amplifiers, because of the limited current carrying capacity of the TSS. Note that the switch disconnects the power from the amplifier while the amplifier is being fully driven, causing the contacts of TSS to switch a high current, and causing arcing across the contacts of the TSS as the contacts open. This can result in damage to the TSS and other circuit elements.

In methods and circuits embodying the invention, a low resistance path is placed across a feedback resistance element of the amplifier, whenever the temperature of the output stage of the amplifier reaches a predetermined threshold level, in order to reduce the gain of the amplifier to a safe level. When the temperature of the output stage decreases to below the predetermined temperature, the low resistance automatically is removed from across the feedback resistance element and normal amplifier operation is resumed.

Figure 1:
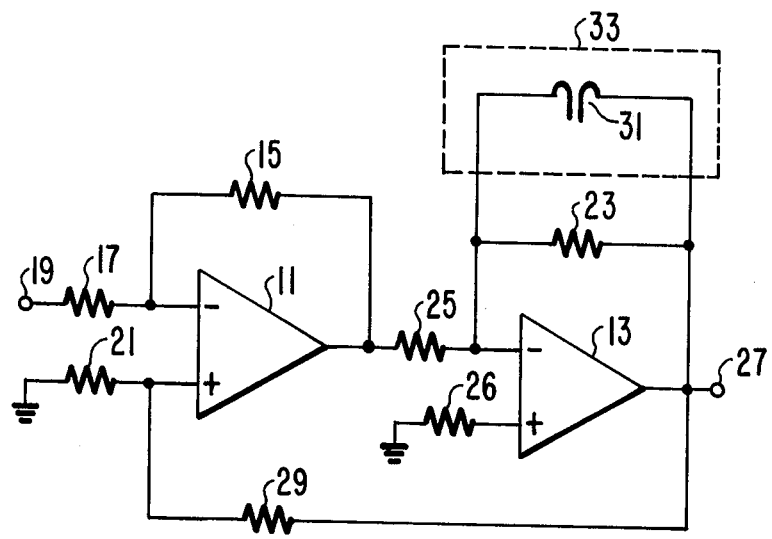
FIG. 1 is a circuit diagram of an audio amplifier embodying the invention.

Referring to FIG. 1, the amplifier may include, for example, a stage of preamplification including operational amplifier 11 and an output stage including operational amplifier 13. The preamplifier includes a feedback resistor 15 connected between the output and inverting input terminals of operational amplifier 11, an input resistor 17 connected between an input terminal 19 and the inverting input terminal (−) of amplifier 11, and another input resistor 21 connected from the non-inverting input terminal (+) of amplifier 11 to a point of reference potential, in this example, ground. The output stage includes a feedback resistor 23 connected between the output and inverting input terminals of operational amplifier 13, an input resistor 25 connected from the output terminal of amplifier 11 to the inverting input terminal of amplifier 13, and a resistor 26 connected from the non-inverting input terminal of amplifier 13 to ground. Feedback resistor 29 is connected between output terminal 27 of amplifier 13 and the non-inverting input terminal of preamplifier 11. A temperature sensitive switch 31 having a pair of normally-open contacts is disposed as a means for connecting a relatively low resistance across feedback resistor 23, whenever the temperature of the output stage reaches a functionally critical threshold temperature. This switch 31 is "heat coupled" to sense the temperature of the output stage and is thermally responsive to close the normally-open contacts thereof when the output stage reaches a predetermined temperature. As is well-known in the art, the thermal coupling between the switch 31 and the output stage could be accomplished using principles of radiation, convection or conduction. However, conduction is utilized in FIG. 1 where the switch 31 is mounted upon a heat sink (indicated schematically by the dashed block 33) for the transistors 41, 43 which may be found in the output stage amplifier 13, as shown in FIG. 2 and discussed below.

Figure 2:
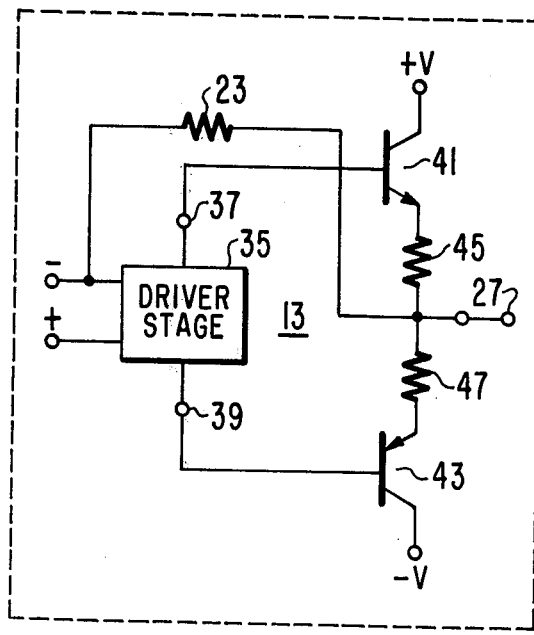
FIG. 2 is a partial block and circuit diagram of a typical output stage of an audio amplifier, such as that of FIG. 1.

Referring to FIG. 2, the output stage operational amplifier 13 may include, for example, a driver stage 35 having inverting and non-inverting input terminals, and a pair of output terminals 37 and 39 connected individually to the base electrodes of NPN and PNP output transistors 41, 43, respectively. The collector electrodes of transistors 41 and 43 are connected to positive and negative voltage supplies, respectively. The emitter electrodes of transistors 41 and 43 are coupled via resistors 45 and 47 to output terminal 27.

In operation, the gain of preamplifier 11 is controlled by the ratio of feedback resistor 15 to input resistor 17, and the gain of the output stage amplifier 13 is controlled by the ratio of the feedback resistor 23 to the input resistor 25. The overall gain of the amplifier is controlled by the ratio of feedback resistor 29 to input resistor 21. When the temperature of the transistors 41, 43 of the output stage 13 reaches the functionally critical threshold or predetermined level, the contacts of the temperature sensitive switch 31 close to connect a relatively low resistance across the feedback resistor 23 which substantially reduces the gain of the output stage amplifier 13 to zero, thereby turning off the transistors 41, 43 of the output stage 13. When the temperature of the transistors 41, 43 of the output stage reduces to below the predetermined functionally critical threshold, the contacts of the temperature sensitive switch 31 will automatically open to disconnect the relatively low resistance from across the feedback resistor 23 which restores the output stage 13 and the amplifier to normal operation.

It should be noted that the contacts of the temperature sensitive switch 31 could have been connected across feedback resistor 15 or feedback resistor 29 to provide thermal protection for the output stage of the amplifier, but such placement of the temperature sensitive switch 31 would not insure the fastest turn-off of the transistors 41, 43 of the output stage 13 in the event of a thermal overload. In the preferred embodiment, as described, the connection of the contacts of the temperature sensitive switch 31 across feedback resistor 23 of the output stage insures fast turn-off of the output stage 13 in the event of a thermal overload. Of course, those skilled in the electronic arts will realize without further explanation that for the sake of simplicity, feedback resistors 15, 23 or 33 are utilized only to generally represent feedback resistance elements which in various embodiments could be a complex series and/or parallel combination of more than one resistor. Furthermore, in the most simplified embodiment where at least one resistor is included in such feedback resistance elements, only a portion of that resistor need be shunted with the relatively low resistance if the output stage temperature can be lowered beneath its functionally critical threshold without reducing the amplifier gain to zero. It should also be recognized that the contacts of switch 31 could be disposed in a relatively low resistance shunt circuit across the feedback resistance elements.

The present invention is not limited to the protection of the amplifier system shown in FIG. 1. The invention can be used to protect substantially any amplifier including feedback networks which determine the gain of the amplifier. An advantage of the invention is that the temperature sensitive switch 31 can be a relatively inexpensive switch, in that the contacts of the switch 31 are only required to switch voltages generally lower than 120 VAC and currents of only a few milliamperes. In the thermal protection circuits of the prior art as discussed in the introductory portion of this application, such switches must be capable of switching at least several amperes.

What I claim is:

1. A method for protecting the transistors in the output stage of an amplifier from thermal overload, said amplifier having a gain in proportion to a feedback resistance element therein, said method comprising the steps of:

sensing the temperature of said output stage; and connecting a relatively low resistance across at least a portion of said feedback resistance element whenever the temperature of said output stage reaches a predetermined threshold level to thereby reduce the gain of said amplifier.

2. The method of claim 1 including the further step of:

disconnecting said low resistance from across said portion of said feedback resistance element when the temperature of said output stage drops below the threshold level.

3. The method of claim 1 wherein the temperature sensing step is accomplished by monitoring the temperature of said transistors in said output stage.

4. A circuit for protecting the transistors in the output stage of an amplifier from thermal overload, said amplifier having a gain in proportion to feedback resistance connected between a signal output terminal and an inverting signal input terminal thereof, said circuit comprising:

means thermally coupled to said output stage for connecting a relatively low resistance across at least a portion of said feedback resistance whenever the temperature of said output stage reaches a predetermined threshold level to thereby reduce the gain of said amplifier.

5. The circuit of claim 4 wherein said low resistance connecting means includes a temperature responsive switch thermally coupled to and at substantially the same ambient temperature as said output stage, said switch having a pair of normally-open contacts connected across said portion of said feedback resistance and responding to close said normally-open contacts when said predetermined threshold level is reached.

6. The circuit of claim 5 wherein said switch is responsive to the temperature of said transistors in said output stage.

7. The circuit of claim 4 wherein said low resistance connecting means includes a temperature responsive switch thermally coupled to said output stage, said switch having a pair of normally-open contacts disposed in a relativley low resistance shunt circuit across at least a portion of said feedback resistance and responding to close said normally-open contacts when said predetermined threshold level is reached.

* * * * *